United States Patent
Heuck et al.

(10) Patent No.: US 11,081,464 B2
(45) Date of Patent: Aug. 3, 2021

(54) METHOD FOR PRODUCING AN INTEGRAL JOIN AND AUTOMATIC PLACEMENT MACHINE

(71) Applicant: Infineon Technologies AG, Neubiberg (DE)

(72) Inventors: Nicolas Heuck, Cremlingen (DE); Marco Marchitto, Bad Sassendorf (DE); Roland Speckels, Kamen (DE)

(73) Assignee: Infineon Technologies AG, Neubiberg (DE)

( * ) Notice: Subject to any disclaimer, the term of this patent is extended or adjusted under 35 U.S.C. 154(b) by 1181 days.

(21) Appl. No.: 15/166,855

(22) Filed: May 27, 2016

(65) Prior Publication Data

US 2016/0351533 A1 Dec. 1, 2016

(30) Foreign Application Priority Data

May 29, 2015 (DE) .......................... 102015108512.7

(51) Int. Cl.
*H01L 23/00* (2006.01)
*B32B 5/16* (2006.01)
(Continued)

(52) U.S. Cl.
CPC .............. *H01L 24/83* (2013.01); *B22F 7/064* (2013.01); *B32B 5/16* (2013.01); *B32B 15/04* (2013.01);
(Continued)

(58) Field of Classification Search
CPC .............. B22F 7/064; H01L 2224/7555; H01L 2224/75611; H01L 2224/7565;
(Continued)

(56) References Cited

U.S. PATENT DOCUMENTS 4,921,128 A * 5/1990 Guigan .................... B65G 1/08
198/550.12
6,825,249 B1 * 11/2004 Takeda ................ H01L 21/4821
523/218
(Continued)

FOREIGN PATENT DOCUMENTS

CN 101341585 A 1/2009
DE 102004019567 B3 1/2006
(Continued)

*Primary Examiner* — Nicholas A Wang
(74) *Attorney, Agent, or Firm* — Murphy, Bilak & Homilier, PLLC

(57) ABSTRACT

A powder carrier, to which a powder layer containing a metal powder is applied, is provided by an automatic powder carrier feed. A first joining partner is pressed onto the powder layer located on the powder carrier so as to bond a powder layer portion to the first joining partner. The first joining partner is raised from the powder carrier together with the powder layer portion bonded to the first joining partner, and the powder layer portion bonded to the first joining partner is arranged between the first and second joining partners. A sintered join is produced between the first and second joining partners by pressing the first and second joining partners against one another such that the powder layer portion makes contact with both the first and second joining partners. The powder layer portion is sintered as the joining partners are being pressed against one another.

12 Claims, 6 Drawing Sheets

(51) Int. Cl.
    *B32B 15/04*         (2006.01)
    *B32B 15/20*         (2006.01)
    *B22F 7/06*          (2006.01)

(52) U.S. Cl.
CPC .............. *B32B 15/20* (2013.01); *H01L 24/27* (2013.01); *H01L 24/743* (2013.01); *H01L 24/75* (2013.01); *B32B 2250/03* (2013.01); *B32B 2264/105* (2013.01); *B32B 2310/028* (2013.01); *B32B 2311/12* (2013.01); *B32B 2311/24* (2013.01); *B32B 2315/02* (2013.01); *B32B 2457/14* (2013.01); *H01L 24/29* (2013.01); *H01L 24/32* (2013.01); *H01L 2224/27436* (2013.01); *H01L 2224/29339* (2013.01); *H01L 2224/32225* (2013.01); *H01L 2224/7555* (2013.01); *H01L 2224/7565* (2013.01); *H01L 2224/75281* (2013.01); *H01L 2224/75282* (2013.01); *H01L 2224/75315* (2013.01); *H01L 2224/75349* (2013.01); *H01L 2224/75611* (2013.01); *H01L 2224/831* (2013.01); *H01L 2224/83005* (2013.01); *H01L 2224/8384* (2013.01); *H01L 2224/83191* (2013.01); *H01L 2224/83201* (2013.01); *H01L 2224/83203* (2013.01); *H01L 2224/83205* (2013.01); *H01L 2224/83424* (2013.01); *H01L 2224/83447* (2013.01); *H01L 2924/13055* (2013.01); *H01L 2924/13091* (2013.01); *H01L 2924/15724* (2013.01); *H01L 2924/15747* (2013.01); *H01L 2924/15787* (2013.01)

(58) Field of Classification Search
CPC ..... H01L 2224/831; H01L 2224/83201; H01L 2224/8384; H01L 24/83
See application file for complete search history.

(56) References Cited

U.S. PATENT DOCUMENTS

| | | | | |
|---|---|---|---|---|
| 2005/0247760 | A1* | 11/2005 | Palm | H01L 21/6835 |
| | | | | 228/193 |
| 2012/0055978 | A1* | 3/2012 | Schafer | B22F 1/0062 |
| | | | | 228/179.1 |
| 2012/0114927 | A1* | 5/2012 | Khaselev | H01L 24/27 |
| | | | | 428/220 |
| 2014/0234649 | A1* | 8/2014 | Kalich | C23C 26/00 |
| | | | | 428/551 |

FOREIGN PATENT DOCUMENTS

| | | | |
|---|---|---|---|
| DE | 102008050798 A1 | | 4/2010 |
| DE | 102013104572 A1 | * | 11/2014 |
| DE | 102013104572 A1 | | 11/2014 |
| JP | H06326240 | * | 11/1994 |
| JP | 2013041884 A | | 2/2013 |
| JP | 2013041994 A | | 2/2013 |

* cited by examiner

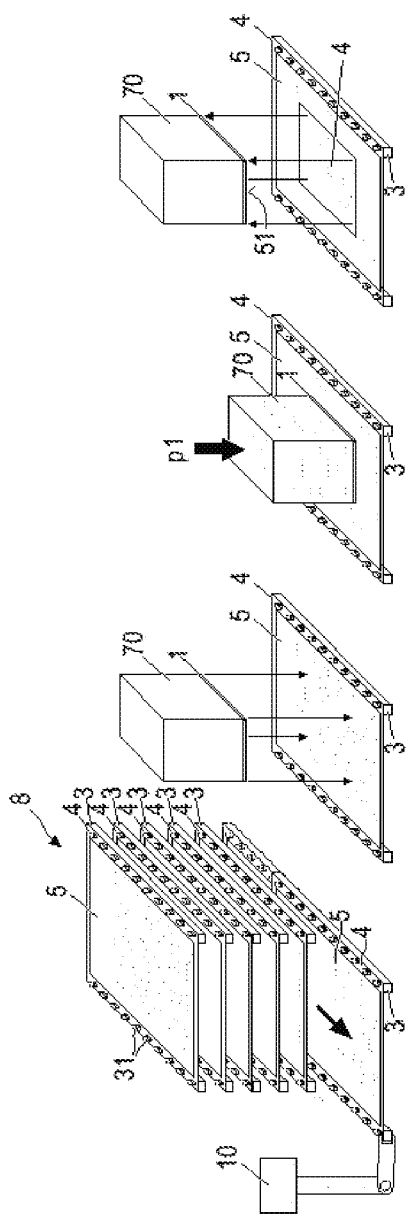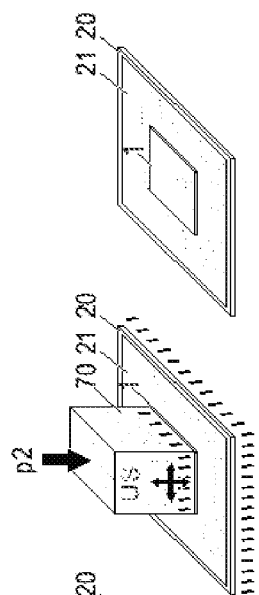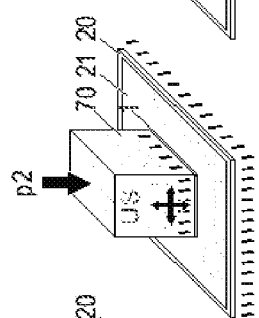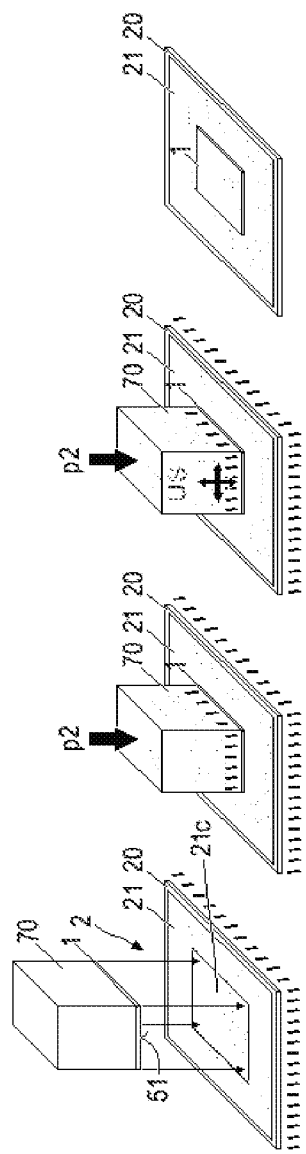

METHOD FOR PRODUCING AN INTEGRAL JOIN AND AUTOMATIC PLACEMENT MACHINE

PRIORITY CLAIM

This application claims priority to German Patent Application No. 10 2015 108 512.7 filed on 29 May 2015, the content of said application incorporated herein by reference in its entirety.

BACKGROUND

In many technical fields, such as for example power electronics, there is a need for mechanical and if appropriate also electrically conductive joins which are resistant to high temperatures and stable under changing temperatures. Particularly in the field of power electronics, increasing power densities and ever more compact designs mean that it is to be expected that the operating temperatures of semiconductor components, electronic assemblies, etc. will increase further.

There is therefore a need for joining techniques which satisfy these requirements. A promising method which has become established is what is termed the low-temperature joining technique (LTJ). Instead of the soft-soldering process commonly used to date, here a silver powder is introduced between the joining parts and sintered, forming an integral join between the parts. This involves the risk that the silver powder is partially lost during processing, and therefore the silver powder is fed manually in conventional methods, this being associated with a high outlay.

SUMMARY

An economical method for producing an integral join which is resistant to high temperatures and stable under changing temperatures is provided, and is a system for carrying out such a method.

A first aspect relates to a method for producing an integral join between a first joining partner and a second joining partner. In the method, a powder carrier, to which a powder layer containing a metal powder is applied, is provided by means of an automatic powder carrier feed. The first joining partner is pressed onto the powder layer located on the powder carrier, such that a powder layer portion bonds to the first joining partner. The first joining partner is raised from the powder carrier together with the powder layer portion bonding to the first joining partner, and the powder layer portion bonding to the first joining partner is arranged between the first joining partner and the second joining partner. A sintered join is produced between the first joining partner and the second joining partner by pressing the first joining partner and the second joining partner against one another such that the powder layer portion makes contact both with the first joining partner and the second joining partner. The powder layer portion is sintered as the joining partners are being pressed against one another.

A second aspect relates to an automatic placement machine for equipping a second joining partner with a first joining partner. The automatic placement machine has an automatic powder carrier feed, by means of which a powder carrier, to which a powder layer containing a metal powder is applied, can be taken together with the powder layer from a magazine. The automatic placement machine also has a placement tool, by means of which a first joining partner can be picked up and, after the powder carrier has been taken from the magazine, can be pressed onto the powder layer located on the powder carrier, such that a portion of the powder layer bonds to the first joining partner. Moreover, the first joining partner can be raised from the powder carrier together with that portion of the powder layer which bonds to the first joining partner by the placement tool. The automatic placement machine is also embodied, after the raising operation, to arrange that portion of the powder layer which bonds to the first joining partner between the first joining partner and the second joining partner in such a way that the portion of the powder layer bears both against the first joining partner and against the second joining partner.

An automatic placement machine embodied in accordance with the second aspect can be embodied in particular to carry out a method in accordance with the first aspect.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 13A to 13H show various steps of a method for producing a sintered join between two joining partners.

DETAILED DESCRIPTION

Figure 1:
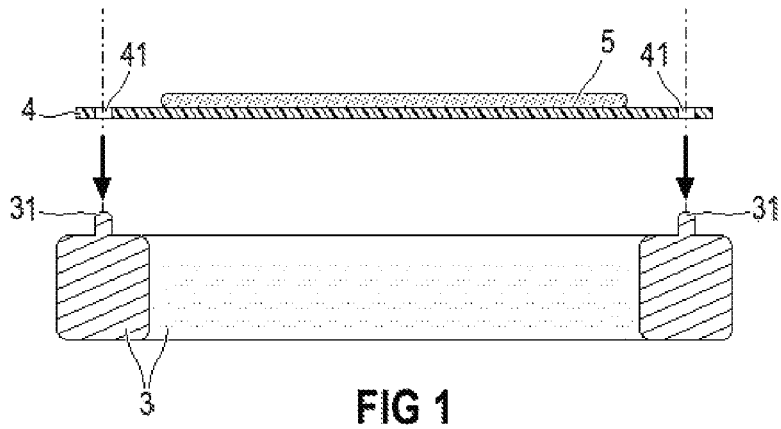
FIGS. 1 to 8 show various steps of a method for producing a sintered join between two joining partners.

FIG. 1 shows a cross section through a powder carrier 4, to which a powder layer 5 is applied. By way of example, the powder carrier 4 may be a thin film, the thickness of which can lie, for example, in the range of 50 µm to 500 µm. The film can consist, for example, of thermally stable materials such as PEN (polyethylene naphthalates), PI (polyimides) or PTFE (polytetrafluoroethylene) or other materials, etc.

The powder layer 5 can comprise a silver powder or consist of a silver powder. By way of example, the powder layer 5 can be applied to the powder carrier 4 by virtue of the fact that a paste containing silver powder and a solvent is applied as a thin layer to the powder carrier 4 and then dried, such that the solvent evaporates and a powder layer remains. The application of the powder layer 5 to the powder carrier 4 is not limited to this method, however. In principle, any other desired method can also be used.

Figure 2:
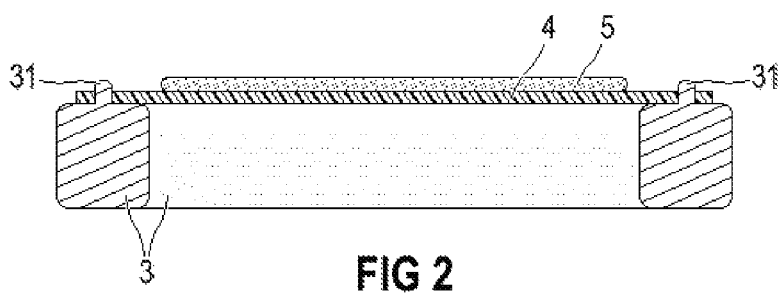

The powder carrier 4 can be arranged together with the powder layer 5 located thereon on a supporting frame 3, the result of which is shown in FIG. 2. As an alternative, it is initially also possible for only the powder carrier 4 without the powder layer 5 to be arranged on the supporting frame 3, and only thereafter can the powder layer 5 be applied to the powder carrier 4, as explained above, the result of this likewise being an arrangement as shown in FIG. 2.

In order to simplify the positioning of the powder carrier 4 on the supporting frame 3 and to fasten the powder carrier 4 securely on the supporting frame 3, the supporting frame 3 can optionally have a plurality of alignment pins 31, each of which engages into a corresponding alignment opening 41 in the powder carrier 4. By way of example, the alignment openings 41 can be arranged in two parallel rows each running close to a lateral edge of the powder carrier 4. Alignment openings 41 of this type can be used for accurately positioning the powder carrier 4 and/or for feeding the powder carrier 4, for example by means of a tractor. In principle, however, any other desired alignment elements can also be used instead of alignment openings 41 and alignment pins 31.

In the case of a powder carrier 4 embodied as a film, the film can be stretched onto the supporting frame 3. This means that the film is expanded before it is fastened on the supporting frame 3, and is fastened on the supporting frame 3 in an expanded state. When fastened, the film remains expanded with respect to the relaxed state. If the film is stretched onto the supporting frame 3 once the powder layer 5 has already been applied to it, expansion of the film may take place only to such an extent that the powder layer 5 is not damaged.

Figure 3:
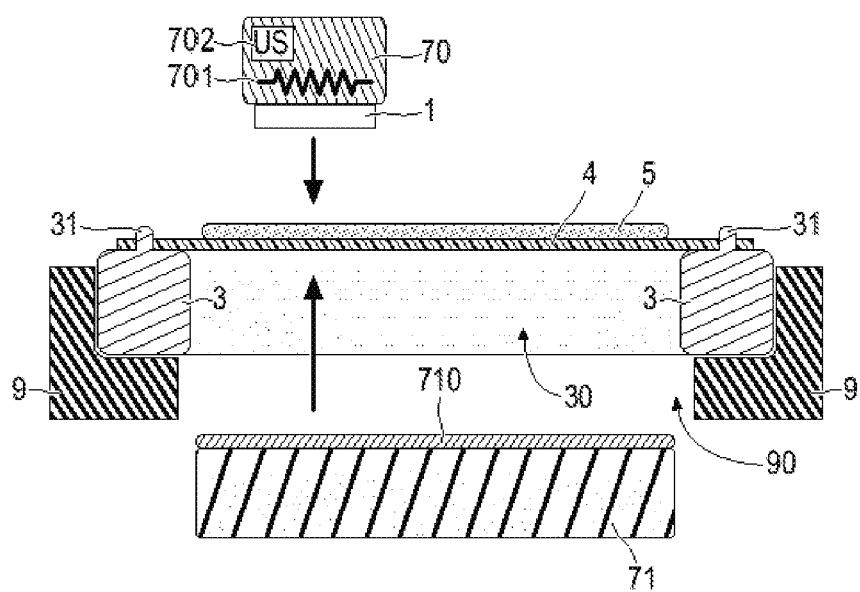
Figure 4:
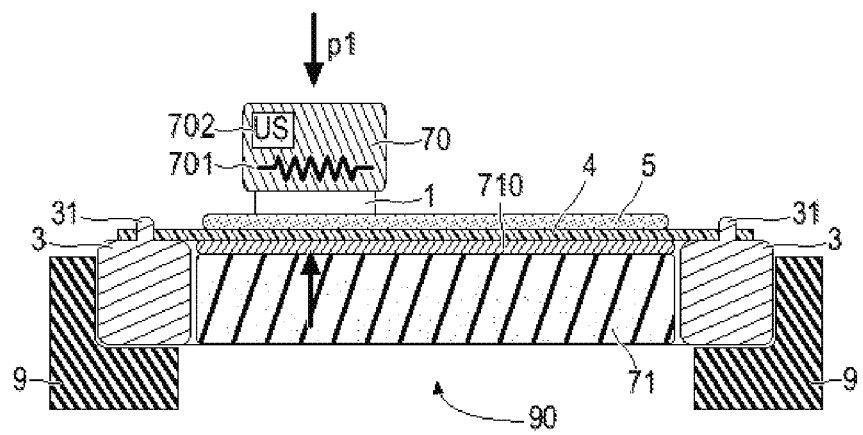

As is shown further in FIG. 3, and as a result in FIG. 4, a first joining partner 1 can be picked up, for example, by means of a placement tool 70 of an automatic placement machine (e.g. of a die bonder), placed onto the powder layer 5 located on the powder carrier 4 and pressed with a first contact pressure p1 against the powder layer 5. In this process, the powder layer 5 is located between the first joining partner 1 and the powder carrier 4. The first contact pressure p1 may be chosen, for example, to be greater than 0.1 MPa and/or smaller than 20 MPa. In order to allow for a sufficient first contact pressure p1 to be built up, provision can be made of a first counterholder 71, which bears against that side of the powder carrier 4 which is remote from the powder layer 5 during the pressing operation.

The first counterholder 71 can optionally have an elastic equalization mat 710 (e.g. made of silicone or of a perfluoroelastomer), which bears against that side of the powder carrier 4 which is remote from the powder layer 5 during the pressing operation. The use of such an equalization mat 710 ensures a clean release of the powder layer portion 51 of the powder layer 5 from the powder carrier 4.

Figure 5:
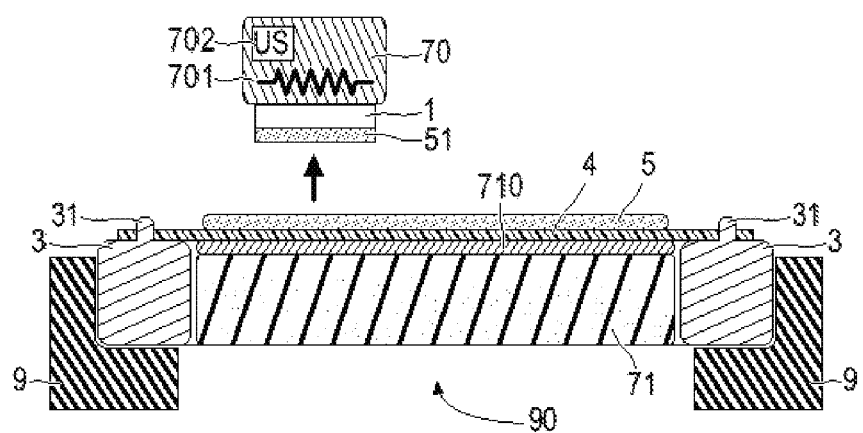

The effect of the first joining partner 1 being pressed onto the powder layer 5 is that a portion 51 of the powder layer 5 (also referred to hereinbelow as "powder layer portion") bonds to the first joining partner 1 when the first joining partner 1, as is shown in FIG. 5, is raised from the powder carrier 4 again. The pressing of the first joining partner 1 onto the powder layer 5 and/or the subsequent raising of the joining partner 1 from the powder carrier 4 together with the powder layer portion 51 bonding to the first joining partner 1 can optionally be effected by the placement tool 70.

As can be seen with reference to FIGS. 3 and 4, the first counterholder 71 and the supporting frame 3 can be adjustable in relation to one another, such that the distance between the first counterholder 71 and the powder carrier 4 (e.g. in a direction perpendicular to the powder carrier 4) can be set. The adjustability can be provided, for example, by virtue of the fact that the first counterholder 71 can be raised and lowered, and/or by virtue of the fact that a conveyor section 9 explained hereinbelow can be raised and lowered together with the supporting frame 3 and the powder carrier 4 mounted thereon and the powder layer 5 located on the powder carrier 4.

It is optionally the case here that the first counterholder 71 can be moved temporarily from a first position in relation to the supporting frame 3 (FIG. 3) to a second position in relation to the supporting frame 3 (FIG. 4). The first contact pressure p1 is generated when the first counterholder 71 is located in the second position (FIG. 4). Thereafter, the first counterholder 71 can optionally be moved back into the first position.

According to one configuration, the supporting frame 3 can have a through-opening 30, into which the first counterholder 71 engages in its second position. In its first position, by contrast, the first counterholder 71 does not engage into the through-opening 30, or engages into the latter only to such an extent that the supporting frame 3 can be displaced arbitrarily by means of a translatory movement in relation to the first counterholder 71, with a constant distance between the first counterholder 71 and the powder carrier 4, without the first counterholder 71 hindering or restricting the translatory movement. In the example shown, the direction of such a translatory movement runs perpendicular to the plane of the illustration.

Figure 12:
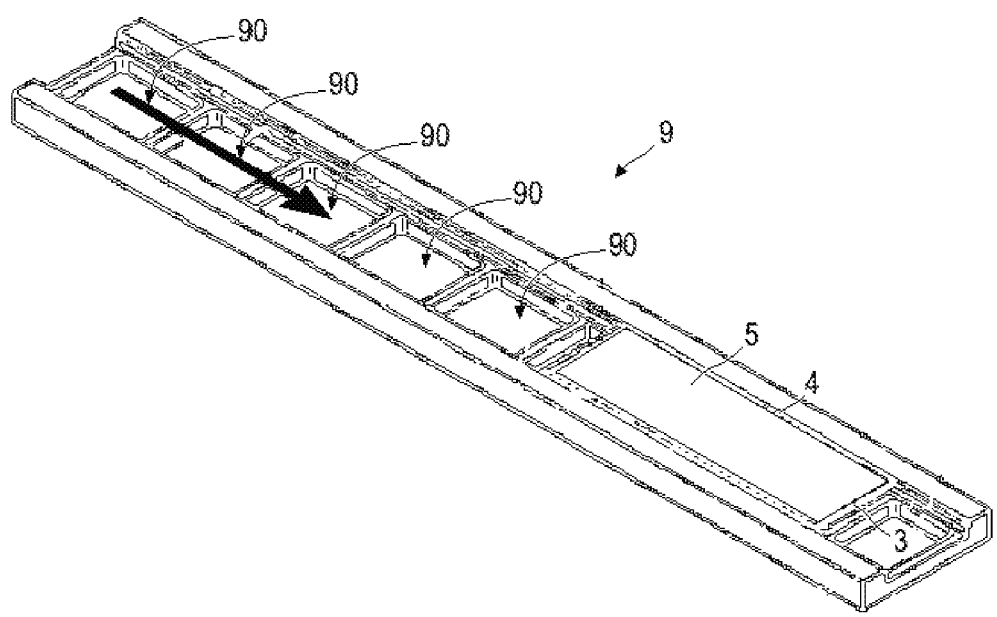
FIG. 12 shows a perspective view of a conveyor section into which a supporting frame equipped with a powder carrier has been placed, a powder layer being applied to the powder carrier.

According to a further, optional configuration, a translatory movement can be effected by means of a conveyor section 9, onto which or into which the supporting frame 3 together with the powder carrier 4 mounted thereon and the powder layer 5 located on the powder carrier 4 is placed. An example of such a conveyor section 9 is shown in FIG. 12.

A conveyor section 9 can have one or more through-openings 90, the first counterholder 71 engaging into one of the through-openings 90 in its second position. In its first position, by contrast, the first counterholder 71 does not engage into said through-opening 90, or engages into the latter only to such an extent that the supporting frame 3 can be displaced arbitrarily along the conveyor section 9 during the translatory movement mentioned in relation to the first counterholder 71 and in relation to the conveyor section 9, with a constant distance between the first counterholder 71 and the powder carrier 4, without the first counterholder 71 hindering or restricting the translatory movement.

Figure 6:
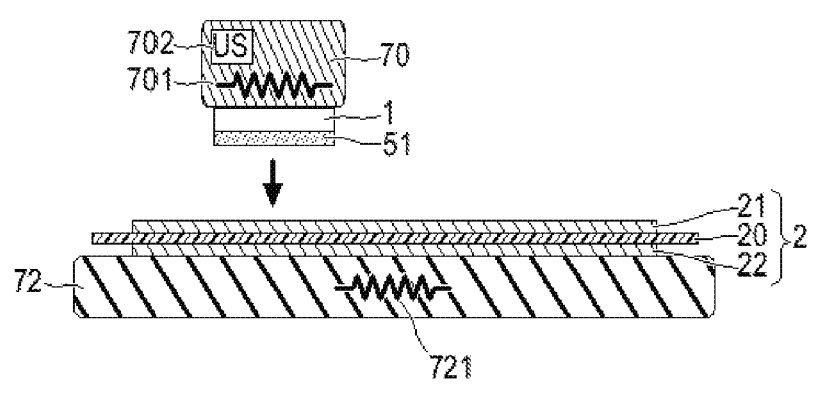
Figure 7:
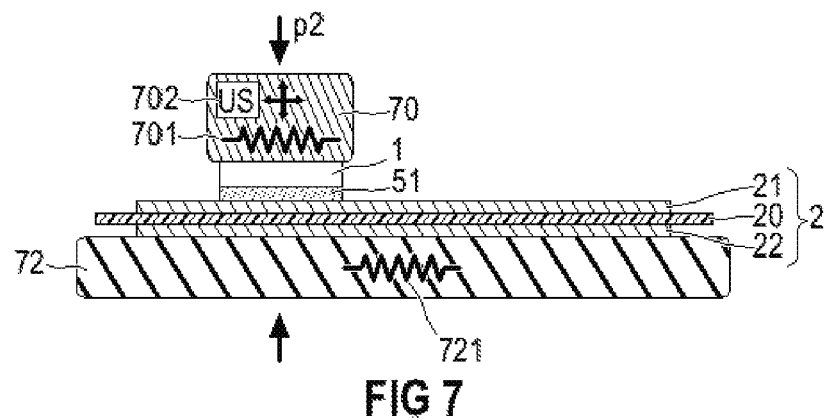

The powder layer portion 51 bonding to the first joining partner 1 is then arranged between the first joining partner 1 and the second joining partner 2, as is shown with reference to FIG. 6, and as a result in FIG. 7, and a sintered join is produced between the first joining partner 1 and the second joining partner 2 by pressing the first joining partner 1 and the second joining partner 2 against one another with the action of a second contact pressure p2, such that the powder layer portion 51 makes contact both with the first joining partner 1 and also with the second joining partner 2 and is sintered in the process. The sintering forms a sintered layer 51' from the powder layer portion 51, said sintered layer being arranged between the first joining partner 1 and the second joining partner 2, extending continuously therebetween and joining the latter integrally to one another. The second contact pressure p2 can amount to at least 0.1 MPa, for example.

By way of example, the first joining partner 1 can be a semiconductor chip, and the second joining partner 2 can be a circuit carrier, for example.

In principle, the semiconductor chip 1 may be any desired semiconductor chip, e.g. a MOSFET (Metal Oxide Semiconductor Field Effect Transistor), an IGBT (Insulated Gate Bipolar Transistor), a thyristor, a JFET (Junction Field Effect Transistor), an HEMT (High Electron Mobility Transistor), a diode, etc.

The second joining partner 2 can be embodied as any desired metal layer. It can be present as an individual part, for example as a leadframe. Similarly, the second joining partner 2 can be embodied as a ceramic substrate having a dielectric insulation carrier 20, which can comprise ceramic or consist of ceramic, for example. Other dielectric materials are likewise possible, however. An upper metalization layer 21 is applied to the insulation carrier 20, as is an optional lower metalization layer 22. The metalization layers 21 and 22 are arranged on opposite sides of the insulation carrier 20 and are joined integrally thereto. Suitable materials for the upper metalization layer 21 and, where present, the lower metalization layer 22 are metals with good electrical conductivity, such as, for example, copper or copper alloys, aluminum or aluminum alloys, but also any other desired metals or alloys. If the insulation carrier 20 comprises ceramic or consists of ceramic, the ceramic may be, for example, aluminum oxide ($Al_2O_3$) or aluminum nitride (AlN) or zirconium oxide ($ZrO_2$), or a mixed ceramic comprising, in addition to at least one of the aforementioned ceramic materials, at least one further ceramic material differing therefrom. By way of example, a circuit carrier 2 can be embodied as a DCB substrate (DCB=Direct Copper Bonding), as a DAB substrate (DAB=Direct Aluminum Bonding), as an AMB substrate (AMB=Active Metal Brazing) or as an IMS substrate (IMS=Insulated Metal Substrate). The upper metalization layer 21 and, where present, the lower metalization layer 22 may each have, independently of one another, a thickness in the range of 0.05 mm to 2.5 mm. The thickness of the insulation carrier 20 can lie in the range of 0.1 mm to 2 mm, for example. Thicknesses which are larger or smaller than those indicated are likewise possible, however.

In order to make it possible for a sufficient second contact pressure p2 to be built up, provision can be made of a second counterholder 72, which bears against that side of the second joining partner 2 which is remote from the first joining partner 1 during the pressing operation.

Figure 8:
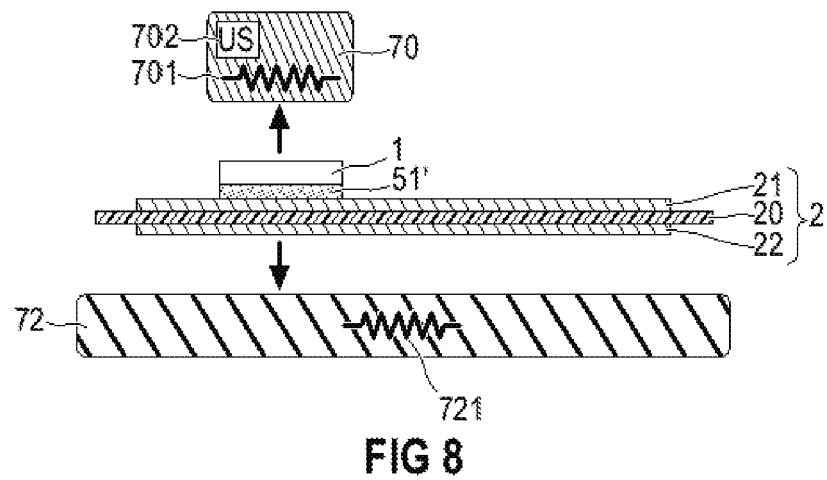

After the sintering, the placement tool 70 and the second counterholder 72 can be removed from the sintered assembly containing the first joining partner 1, the second joining partner 2 and the sintered layer 51', this being shown in FIG. 8.

Figure 9:
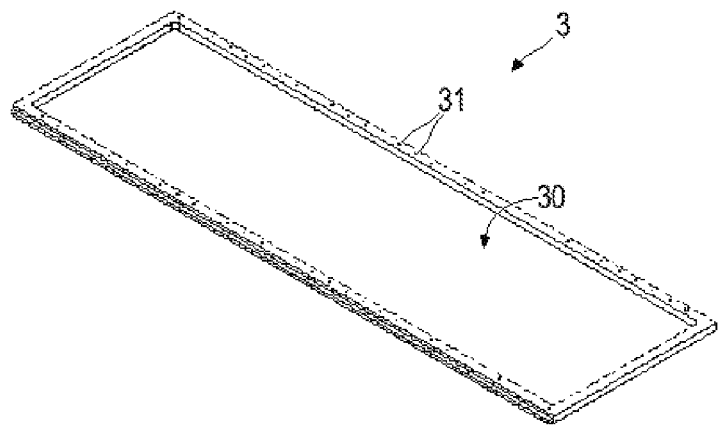
FIG. 9 shows a perspective view of a supporting frame.
Figure 10:
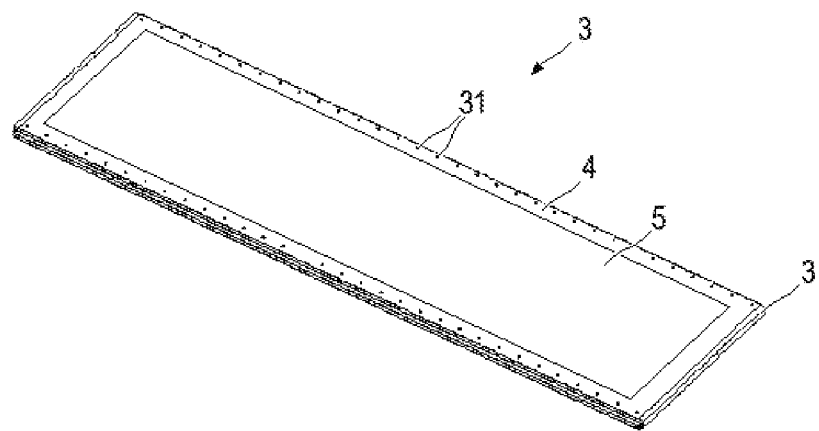
FIG. 10 shows a perspective view of the supporting frame as shown in FIG. 9 equipped with a powder carrier, a powder layer being applied on the powder carrier.

FIG. 9 again shows a perspective view of a supporting frame 3 provided with alignment pins 31, and FIG. 10 shows the supporting frame 3 as shown in FIG. 9 after a powder carrier 4 has been mounted on the supporting frame 3 and after a powder layer 5 has been applied to the powder carrier 4.

In order to simplify the processing, use can be made of a magazine 8 that can accommodate two or more supporting frames 3, on each of which, as explained, a powder carrier 4 provided with a powder layer 5 can be mounted. In order to provide the method described above with a supporting frame 3 on which a powder carrier 4 provided with a powder layer 5, as explained with reference to FIG. 2, is mounted, it is possible for one of the supporting frames 3 located in the magazine 8, together with the powder carrier 4 mounted thereon and the powder layer 5 located on said powder carrier 4, to be taken from the magazine 8.

Figure 11:
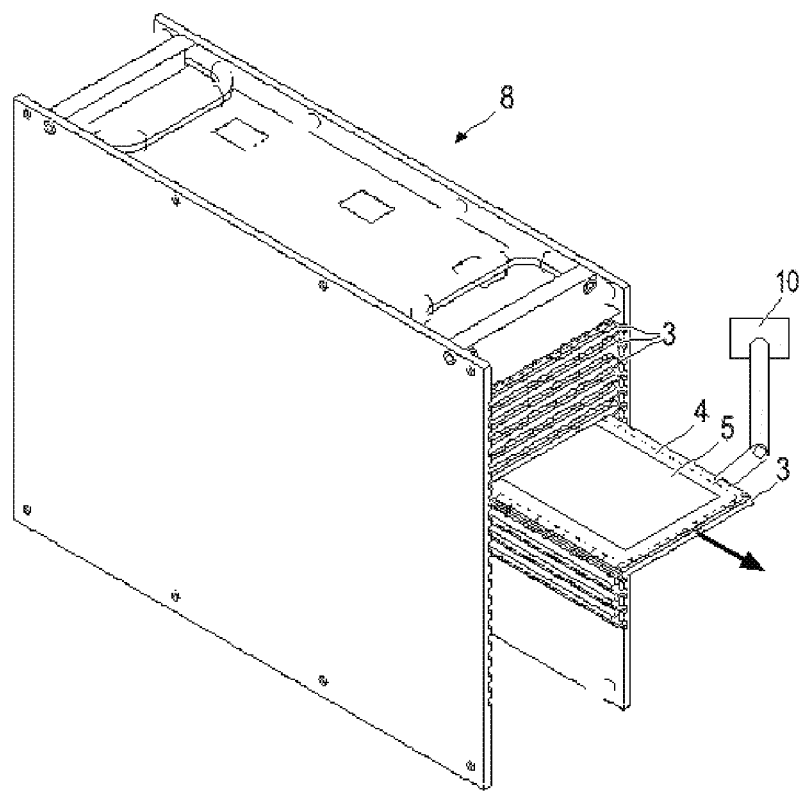
FIG. 11 shows a perspective view of a magazine equipped with a plurality of supporting frames, each of which is equipped with a powder carrier, to which a powder layer is applied.

FIG. 11 shows, by way of example, a magazine 8 equipped in such a manner during the removal of one of the supporting frames 3, in the case of which one of the supporting frames 3 located in the magazine 8, together with the associated powder carrier 4 and the powder layer 5 located thereon, is taken out from the magazine 8 in the direction of the arrow, it being possible for this to be effected, for example, by means of a schematically illustrated automatic conveying device 10, e.g. a gripper or another suitable automatic conveying device.

The supporting frame 3 taken from the magazine 8 can then be moved, together with the associated powder carrier 4 and the powder layer 5 located thereon, to the position at which the first joining partner 1 is pressed against the powder layer 5. This position corresponds to the position shown in FIGS. 3 to 5. For this purpose, as is shown by way of example in FIG. 12, the supporting frame 3 taken from the magazine 8 can then be placed, together with the associated powder carrier 4 and the powder layer 5 located thereon, on an optional conveyor section 9, and can be moved by means of the latter to the position (denoted by a thick arrow in FIG. 12) at which the first joining partner 1 is then pressed against the powder layer 5.

The method explained is now illustrated once again as an overview with reference to FIGS. 13A to 13H.

FIG. 13A shows a plurality of supporting frames 3 located in a magazine 8 (the magazine itself is denoted merely by virtue of its reference sign; an example of such a magazine 8 is shown in FIG. 11), on each of which supporting frames there is mounted a powder carrier 4 provided with a powder layer 5. By means of an automatic conveying device 10, one of the supporting frames 3, together with the associated powder carrier 4 and the powder layer located thereon, is taken from the magazine 8, placed on a conveyor section (not shown; an example of such a conveyor section 9 is shown in FIG. 12) and moved into a position, by means of the conveyor section, in which a first joining partner 1 is then pressed against the powder layer 5 located on the powder carrier 4. FIG. 13B shows the supporting frame 3 in this position. In FIG. 13B, the first joining partner 1 is still spaced apart from the powder layer 5, said joining partner being held by a placement tool 70 of an automatic placement machine.

The first joining partner 1 is then placed onto the powder layer 5 located on the powder carrier 4, as is indicated in FIG. 13B with reference to arrows and as is shown as a result in FIG. 13C, and is pressed with the first contact pressure p1 against the powder layer 5 and against the powder carrier 4, this being effected by the placement tool 70. In order to make it possible for a sufficiently high first contact pressure p1 to be built up, use can be made of a first counterholder 71, as has been explained with reference to FIGS. 3 to 5. A first counterholder 71 of this type is not shown in FIGS. 13B and 13C, but may be present. The first contact pressure p1 may be chosen to be greater than 0.1 MPa and/or smaller than 20 MPa, for example.

Before and/or after it is placed onto the powder layer 5, the first joining partner 1 may be heated to temperatures which lie above room temperature, for example to more than 50° C., in order to achieve secure bonding of the powder layer portion 51 on the first joining partner 1. The heating may be effected, for example, by means of a heating element 701 of the placement tool 70 (see FIGS. 3 and 4).

The first joining partner 1 together with the powder layer portion 51 bonding thereto can then be raised from the supporting frame 3 and the powder carrier 4 by the placement tool 70 or in another manner (FIG. 13D) and placed on the second joining partner 2 (FIGS. 13E and 13F) in such a manner that the powder layer portion 51 is located between the first joining partner 1 and the second joining partner 2 and extends continuously from the first joining partner 1 to the second joining partner 2.

In order to prevent a situation in which the powder layer portion 51 bonding to the first joining partner 1 already begins to undergo significant sintering before the first joining partner 1 together with the powder layer portion 51 bonding thereto is placed onto the second joining partner 2, it is possible for the first joining partner 1, from the placement of the first joining partner 1 on the powder carrier 4 provided with the powder layer 5 (FIGS. 4 and 13C) up to the placement of the first joining partner 1 together with the powder layer portion 51 bonding thereto on the second joining partner 2, to be held at temperatures which are so low that the metal powder located in the powder layer portion 51 does not begin to sinter or does not begin to undergo significant sintering, for example at temperatures in the region of less than 100° C.

According to an option shown in FIGS. 13E and 13F on the basis of stylized flames beneath the second joining partner 2, the second joining partner 2 can be preheated before the placement of the first joining partner 1 and of the powder layer portion 51 bonding thereto, for example to temperatures of at least 100° C., such that the sintering process starts virtually without delay after the placement of the first joining partner 1, including the powder layer portion 51 bonding thereto, on the second joining partner 2, as a result of which the process time can be reduced considerably. It is optionally possible for the second joining partner 2, during the preheating, to be heated to temperatures of less than 400° C., in order to minimize the thermal loading of the first joining partner 1 after the placement thereof. The second joining partner 2 can be heated, for example, by means of a heating element 721 of the second counterholder 72 (FIGS. 6 and 7). A second counterholder 72 of this type is not shown in FIGS. 13E and 13F, but may be present.

After the first joining partner 1 and the powder layer portion 51 bonding thereto have been placed on the second joining partner 2, the placement tool 70 can optionally be heated, in order to accelerate the sintering of the metal powder located in the powder layer portion 51. To heat the placement tool 70, the latter may have an integrated resistance heating element 701, as has already been explained.

As is moreover shown in FIG. 13G and the corresponding FIG. 7, a sound signal US is coupled into the powder layer portion 51 for sintering. To this end, use is made of an ultrasound generator 702, e.g. a piezoelectric sound generator, which can be integrated, for example, in the placement tool 70. The coupled-in sound signal US brings about an input of energy and also a compaction of the metal powder present in the powder layer portion 51, this leading to a reduction in the degree of porosity, as a result of which it is possible both for the sintering duration to be shortened and also for the quality of the sintered join produced to be increased.

The powder layer portion 51 may in any case be sintered in a sintering process which, during a predefined sintering duration, uninterruptedly satisfies the provisions that the powder layer portion 51 is arranged between the first joining partner 1 and the second joining partner 2 and extends continuously from the first joining partner 1 to the second joining partner 2, that the first joining partner 1 and the second joining partner 2 are pressed against one another with contact pressures p2 above a minimum contact pressure (e.g. 0.1 MPa), that the powder layer portion 51 is held in a temperature range lying above a minimum temperature, and that an ultrasound signal US is coupled into the powder layer portion 51.

FIG. 13H and the corresponding FIG. 8 show the finished assembly, in which the first joining partner 1 and the second joining partner 2 are connected to one another fixedly and integrally and optionally also in an electrically conductive manner by the sintered powder layer portion 51'.

The present invention makes it possible to increase the throughput during production and to eliminate potential sources of faults based on manual activities. To this end, an automatic placement machine (e.g. a die bonder) can be provided by means of an automatic powder carrier feed (this has, for example, a conveying device 10 and/or a conveyor section 9), said automatic placement machine feeding a powder carrier 4 (and to this end taking it from a magazine 8, for example) on which there is located a powder layer 5. After the powder carrier 4 provided with the powder layer 5 has been fed, a first joining partner 1 can be placed by means of a placement tool 70 onto the powder layer 5 and pressed against the latter and against the powder carrier 4, such that a portion 51 of the powder layer 5 bonds to the first joining partner 1 and, together with the first joining partner 1, can be raised from the powder carrier 4 and processed further.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integral join between a first joining partner and a second joining partner, the method comprising:
   providing a powder carrier to which a powder layer containing a metal powder is applied, by means of an automatic powder carrier feed;
   receiving the first joining partner by means of a placement tool of a placement machine;
   pressing the first joining partner onto the powder layer located on the powder carrier, so as to bond a powder layer portion to the first joining partner, by means of the placement tool;
   raising the first joining partner from the powder carrier together with the powder layer portion bonded to the first joining partner, by means of the placement tool;
   placing the first joining partner on the second joining partner, by means of the placement tool, such that the powder layer section extends continuously between the first joining partner and the second joining partner; and
   producing a sintered join between the first joining partner and the second joining partner by pressing the first joining partner and the second joining partner against one another such that the powder layer portion makes contact with both the first joining partner and the second joining partner, the powder layer portion being sintered as the first and second joining partners are being pressed against one another.

2. The method of claim 1, wherein the powder carrier is a carrier film.

3. The method of claim 1, wherein the powder layer comprises a silver powder.

4. The method of claim 1, wherein the powder carrier and the powder layer are arranged in a magazine, and wherein the powder carrier is provided by the powder carrier together with the powder layer being taken from the magazine by means of an automatic conveyor.

5. The method of claim 1, wherein the first joining partner is a semiconductor chip.

6. The method of claim 1, wherein the second joining partner is a ceramic substrate having a ceramic insulation carrier to which an upper metallization layer is applied, and wherein the sintering is effected in such a way that the first joining partner is joined to the second joining partner at the upper metallization layer.

7. The method of claim 1, wherein the powder carrier is provided on a supporting frame.

8. The method of claim 7, wherein the supporting frame has alignment pins each of which engages into a corresponding alignment opening in the powder carrier.

9. The method of claim 7, wherein as the first joining partner is being pressed onto the powder layer located on the powder carrier, a counterholder presses against a side of the powder carrier which is remote from the powder layer.

10. The method of claim 9, wherein the counterholder and the supporting frame are adjustable in relation to one another between a first relative position and a second relative position, wherein the counterholder is spaced apart from the powder carrier placed into the supporting frame in the first relative position, and wherein the counterholder bears against the side of the powder carrier remote from the powder layer and which is placed into the supporting frame in the second relative position.

11. The method of claim 10, wherein the first joining partner is pressed onto the powder layer located on the powder carrier in the second relative position, and wherein the counterholder engages into a through-opening in the supporting frame in the second relative position but not in the first relative position.

12. The method of claim 10, wherein the powder carrier together with the powder layer located thereon is arranged in a conveyor section during the pressing-on operation, and wherein the conveyor section has a through-opening into which the counterholder engages in the second relative position.

* * * * *